(12) United States Patent
Ramachandran et al.

(10) Patent No.: US 9,059,263 B2
(45) Date of Patent: Jun. 16, 2015

(54) LOW-K DIELECTRIC PROTECTION SPACER FOR PATTERNING THROUGH SUBSTRATE VIAS THROUGH A LOW-K WIRING LAYER

(75) Inventors: Vidhya Ramachandran, San Diego, CA (US); Shiqun Gu, San Diego, CA (US)

(73) Assignee: QUALCOMM Incorpated, San Diego, CA (US)

( * ) Notice: Subject to any disclaimer, the term of this patent is extended or adjusted under 35 U.S.C. 154(b) by 326 days.

(21) Appl. No.: 13/588,438

(22) Filed: Aug. 17, 2012

(65) Prior Publication Data

US 2013/0113068 A1 May 9, 2013

Related U.S. Application Data

(60) Provisional application No. 61/557,842, filed on Nov. 9, 2011.

(51) Int. Cl.
*H01L 21/338* (2006.01)
*H01L 21/768* (2006.01)
*H01L 23/48* (2006.01)

(52) U.S. Cl.
CPC .... *H01L 21/76898* (2013.01); *H01L 21/76831* (2013.01); *H01L 23/481* (2013.01); *H01L 2924/0002* (2013.01)

(58) Field of Classification Search
CPC ............ H01L 21/0338; H01L 51/5044; H01L 51/525
USPC .................................. 438/267; 257/E21.205
See application file for complete search history.

(56) References Cited

U.S. PATENT DOCUMENTS

| 7,081,407 | B2 | 7/2006 | Annapragada et al. |
| 7,169,698 | B2 | 1/2007 | Gambino et al. |
| 7,205,226 | B1 | 4/2007 | Schaefer et al. |
| 7,781,332 | B2 | 8/2010 | Arnold et al. |
| 2005/0001326 | A1 | 1/2005 | Masuda |
| 2007/0029611 | A1 | 2/2007 | Phan et al. |
| 2008/0142990 | A1* | 6/2008 | Yu et al. ........................ 257/777 |
| 2008/0150089 | A1 | 6/2008 | Kwon et al. |
| 2009/0087992 | A1 | 4/2009 | Srivastava et al. |

(Continued)

FOREIGN PATENT DOCUMENTS

KR 20080093911 A 10/2008

OTHER PUBLICATIONS

International Search Report and Written Opinion—PCT/US2012/064531—ISA/EPO—Feb. 8, 2013.

*Primary Examiner* — Zandra Smith
*Assistant Examiner* — Mohammad Choudhry
(74) *Attorney, Agent, or Firm* — Michelle S. Gallardo

(57) ABSTRACT

A low-K value dielectric protection spacer for patterning through substrate vias (TSVs) through a low-K value wiring layer. A method for forming a low-K value dielectric protection spacer includes etching a via opening through a low-K value dielectric interconnect layer. A protective layer is deposited in the via opening and on the low-K value dielectric interconnect layer. At least a portion of the protective layer is etched from the bottom of the via opening and from a horizontal surface of the low-K value dielectric interconnect layer. The etching leaving a protective sidewall spacer on a sidewall of the via opening. A through substrate via is etched through the bottom of the via opening and through the semiconductor substrate. The through substrate via is filled with a conductive material.

19 Claims, 10 Drawing Sheets

(56) References Cited

U.S. PATENT DOCUMENTS

| | | |
|---|---|---|
| 2009/0315154 A1 | 12/2009 | Kirby et al. |
| 2010/0130008 A1 | 5/2010 | Smith |
| 2010/0178761 A1 | 7/2010 | Chen et al. |
| 2012/0094437 A1* | 4/2012 | Han et al. ............ 438/109 |
| 2013/0093098 A1* | 4/2013 | Yang et al. .......... 257/774 |

* cited by examiner

LOW-K DIELECTRIC PROTECTION SPACER FOR PATTERNING THROUGH SUBSTRATE VIAS THROUGH A LOW-K WIRING LAYER

CROSS REFERENCE TO RELATED APPLICATION

The present application claims the benefit of U.S. provisional patent application No. 61/557,842 in the names of RAMACHANDRAN et al., filed on Nov. 9, 2011.

TECHNICAL FIELD

The present disclosure generally relates to integrated circuits (ICs). More specifically, the present disclosure relates to a low-K dielectric protection spacer for patterning through substrate vias (TSVs) through a low-K wiring layer.

BACKGROUND

TSVs (through substrate vias (also referred to as a through silicon vias)) can be created by etching though a substrate, such as a silicon substrate, sapphire substrate or other type of substrate. The etch also penetrates materials on top of the substrate, such as low-K IMD (inter-metal dielectric) layers, and conductive metal) layers.

When etching through the low-K IMD, the interaction between etch chemicals and the low-K IMD layer may lead to both an electrical and mechanical degradation of a low-K interface to the TSV. The etch process can lead to significant serration of IMD sidewalls as well as cause damage to the low-K sidewall material. This may be seen in a final TSV etched through multiple low-K interconnect layers (see FIG. 3 discussed in detail below).

The TSV thus degrades the interconnect film, and the resultant non-ideal TSV profile may lead to difficulty in subsequent TSV fabrication steps, including liner deposition and fill, as well as reducing the TSV yield and integrity. Conventionally, problems relating to etch damage and sidewall roughness are overcome by improving the liner isolation and TSV fill processes.

SUMMARY

According to one aspect of the present disclosure, a low-K dielectric protection spacer for patterning through substrate vias (TSVs) through a low-K value wiring layer is described. A method for forming a low-K value dielectric protection spacer includes etching a via opening through a low-K value dielectric interconnect layer. A protective layer is deposited in the via opening and on the low-K value dielectric interconnect layer. At least a portion of the protective layer is etched from the bottom of the via opening and from a horizontal surface of the low-K value dielectric interconnect layer. The etching leaves a protective sidewall spacer on a sidewall of the via opening. A through substrate via is etched through the bottom of the via opening and through the semiconductor substrate. The through substrate via is filled with a conductive material.

In a further aspect of the disclosure, a semiconductor die including a low-K value dielectric protection spacer is described. The semiconductor die includes a semiconductor substrate. The semiconductor substrate includes a low-K value dielectric interconnect layer on a surface of the semiconductor substrate. The semiconductor die also includes at least one through substrate via. In one configuration, the through substrate via extends through the low-K value dielectric interconnect layer and the semiconductor substrate. The semiconductor die also includes a protective spacer between the through substrate via(s) and the low-K value dielectric interconnect layer.

In another aspect of the disclosure, a semiconductor die includes means for protecting a low-K value dielectric interconnect layer. The semiconductor die includes a semiconductor substrate. The semiconductor substrate includes a low-K value dielectric interconnect layer on a surface of the semiconductor substrate. The semiconductor die also includes at least one through substrate via. In one configuration, the through substrate via extends through the low-K value dielectric interconnect layer and the semiconductor substrate. The semiconductor die also includes means for protecting the low-K value dielectric interconnect layer disposed between the through substrate via(s) and the low-K value dielectric interconnect layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Various aspects of the disclosure provide techniques to mitigate problems relating to etch damage and sidewall roughness caused by etching TSVs (through substrate vias) through a low-K IMD (inter-metal dielectric) layer. According to one aspect of the present disclosure, a low-K dielectric protection spacer is provided for patterning through substrate vias (TSVs) through a low-K wiring layer. In one configuration of a semiconductor die, a protective sidewall spacer protects a low-K interconnect module sidewall from etch damage, while smoothing the sidewall surface. The resulting smooth sidewall surface leads to improved conditions for post etch processing. In a further configuration, an oxide buffer provided by the protective sidewall spacer between a TSV and any surrounding material provides additional stress relief. Also, the protective sidewalk spacer may provide the ability to pattern the TSV through various kinds of films, regardless of whether the film is damaged by the TSV etch.

Figure 1:
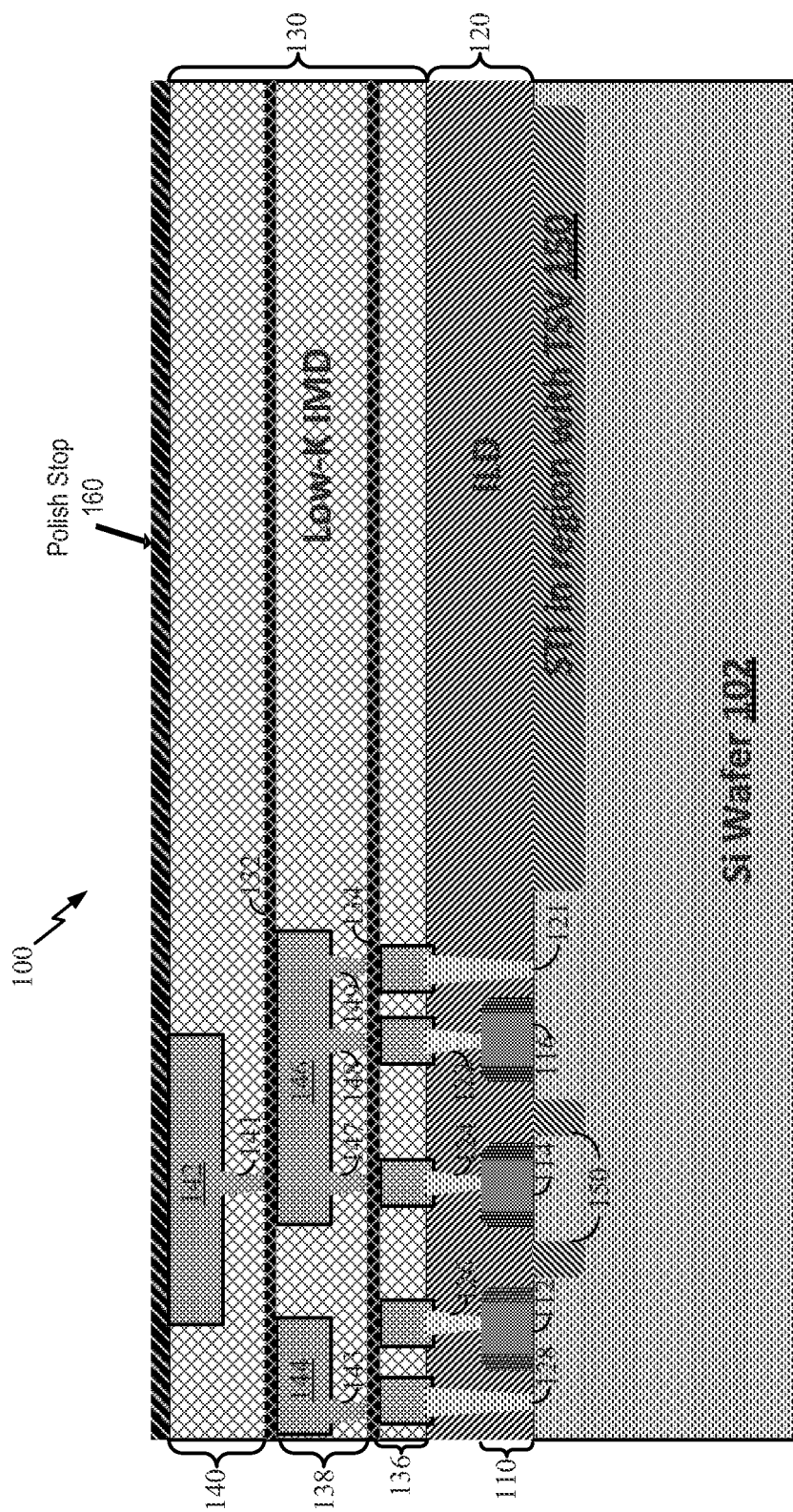
FIG. 1 shows a cross-sectional view illustrating an integrated circuit (IC) package including a low-K interconnect module according to one aspect of the disclosure.

FIG. 1 shows a cross-sectional view illustrating an integrated circuit (IC) package 100 including a low-K interconnect module 130 having back-end of line (BEOL) interconnect layers 136, 138, and 110, according to one aspect of the present disclosure. Representatively, the IC package 100 includes a substrate (e.g., a silicon wafer) 102 including a shallow trench isolation (STI) region 150. In this configuration, the STI region 150 is a semi-metallic or other like material. Above the STI region 150 is an inter-layer dielectric (ILD) layer 120 including a front-end of line (FEOL) interconnect layer 110. The ILD 120 may protect devices (e.g., transistors) 112-116 and conductive wires (vias) 121-128 from future processing steps that may impact the device, while also providing electrical isolation between transistors and routing layers. In this configuration, the ILD layer 120 is a contact ILD formed of a silicon oxide or other like material for preventing shorting between the conductive wires 121-128. In an alternative configuration, the ILD layer 120 is a low-K dielectric or other like material. Above the ILD 120 is the low-K interconnect layer (module) 130.

As shown in FIG. 1, the low-K interconnect module 130 include BEOL layers 136, 138, and 140 formed within low-K inter-metal dielectric (IMD) layers. Representatively, the low-K interconnect module 130 includes a first BEOL interconnect layer 136 having conductive lines and an isolation (e.g., etch stop) layer 134. The low-K interconnect module 130 further include a second BEOL interconnect layer 138 including vias 143 and 147-149, conductive lines 144 and 146, and an isolation (e.g., etch stop) layer 132. The low-K interconnect module 130 further include a third BEOL interconnect layer 140 including via 141 and conductive line 142, covered by a polish stop layer 160. In this configuration, the conductive lines of the first BEOL interconnect layer 136, the conductive lines 144 and 146 of second BEOL interconnect layer 138, the conductive line 142 of the third BEOL, interconnect layer 140, as well as the vias 141, 143, 147, and 149 are formed of a copper or other like conductive material. In addition, the polish stop layer 160 may be formed of a silicon carbide, silicon nitride, or other like protective material. The low-K inter-metal dielectric may include materials such as glass, carbon/nitrogen/fluorine-doped oxides both porous and non-porous, polymers, spin-on-glasses, and other like inorganic insulators.

Figure 2:
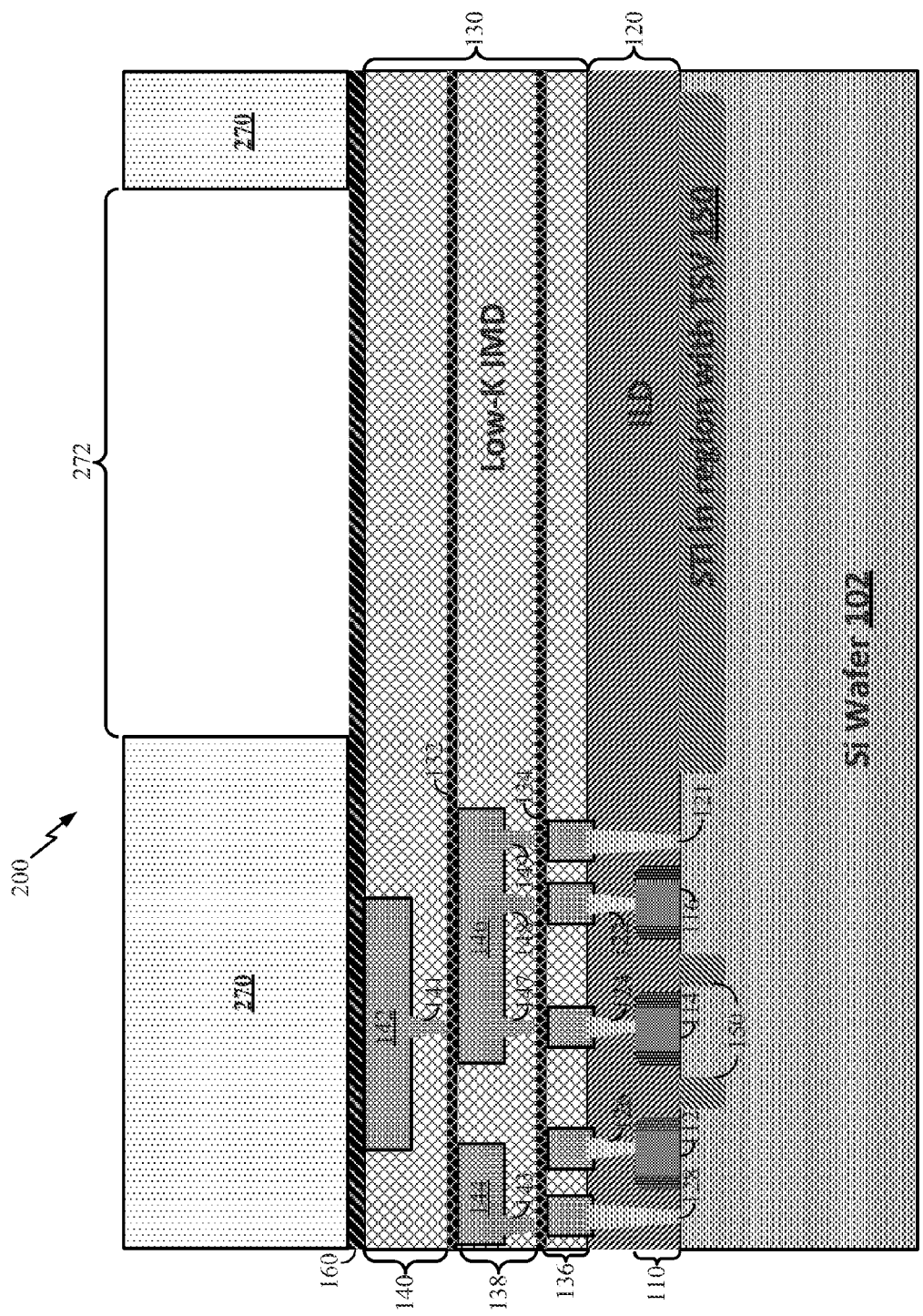
FIG. 2 shows a cross-sectional view illustrating the IC package of FIG. 1, including a photo resist layer to provided an increased size opening for a spacer layer according to one aspect of the disclosure.

FIG. 2 shows a cross-sectional view illustrating the IC package 200 of FIG. 1, including a photo resist layer 270 to provided an increased size TSV opening 272 for a spacer layer and a TSV (through-substrate via) according to one aspect of the present disclosure. The increased size of the TSV opening 272 compensates for a protective layer that will be discussed in more detail below. As shown in FIG. 2, after depositing the polish stop layer 160 on a surface of the low-K interconnect module 130, a lithography process defines a TSV (through-substrate via) opening 272 that is slightly larger than an actual, final TSV (see FIGS. 7 and 8). In this configuration, a size of the TSV shape is on the order of 0.25-20 micro-meters (μm). Typical technologies where this method may be applicable are from the 130 nm node down to 5 nm node.

Figure 3:
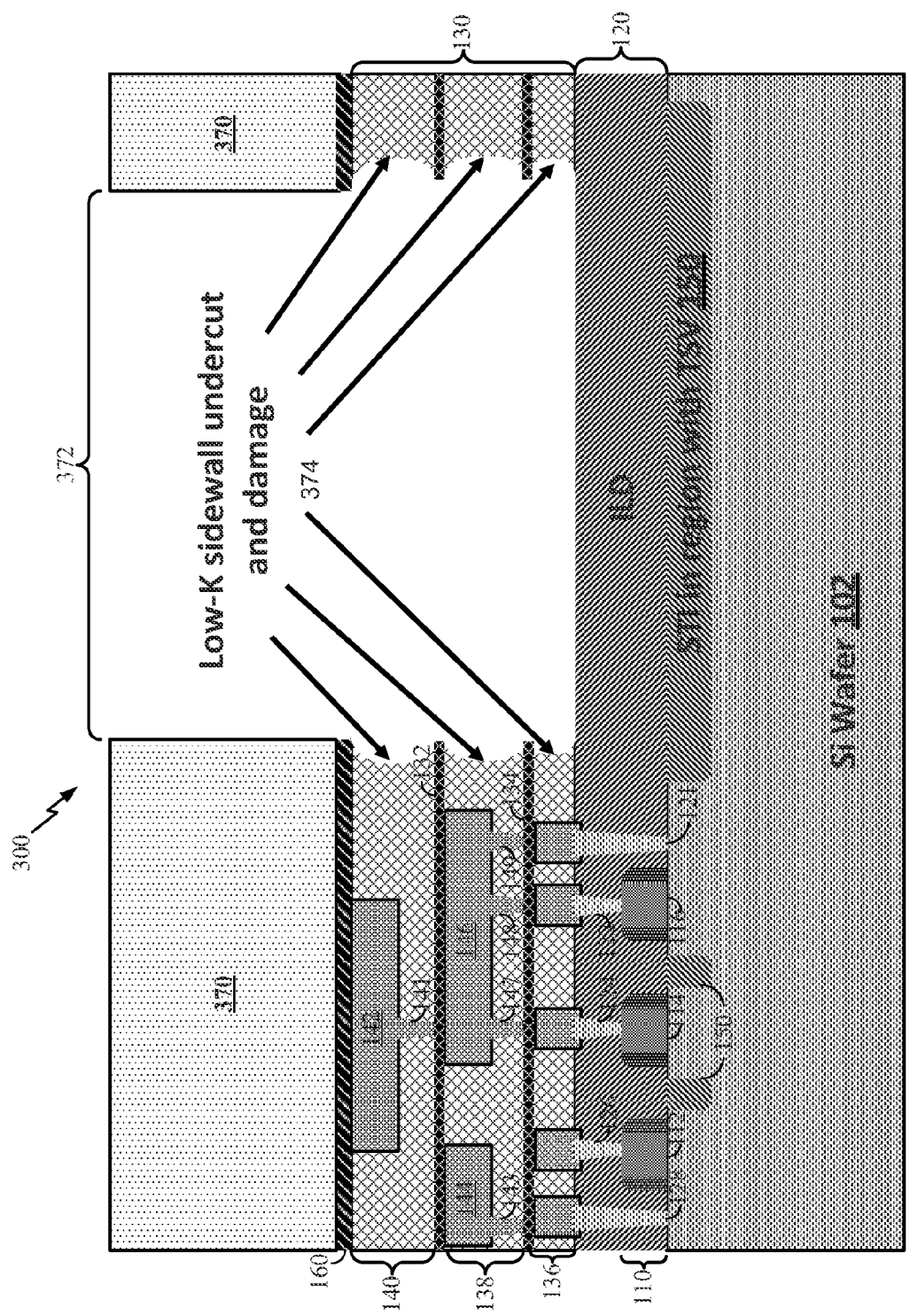
FIG. 3 shows a cross-sectional view illustrating the IC package of FIG. 2, illustrating serration of an interface between the low-K interconnect module and a TSV (through-substrate via) according to one aspect of the disclosure.

FIG. 3 shows a cross-sectional view illustrating the IC package 300 of FIG. 2, illustrating serration of a sidewall 374 of the low-K interconnect module 130 according to one aspect of the present disclosure. Representatively, etching of the low-K interconnect module 130 according to the photo resist layer 370 to form the via opening 372 may undercut and damage the sidewalls 374 of the low-k interconnect module 130, as shown in FIG. 3.

Figure 4:
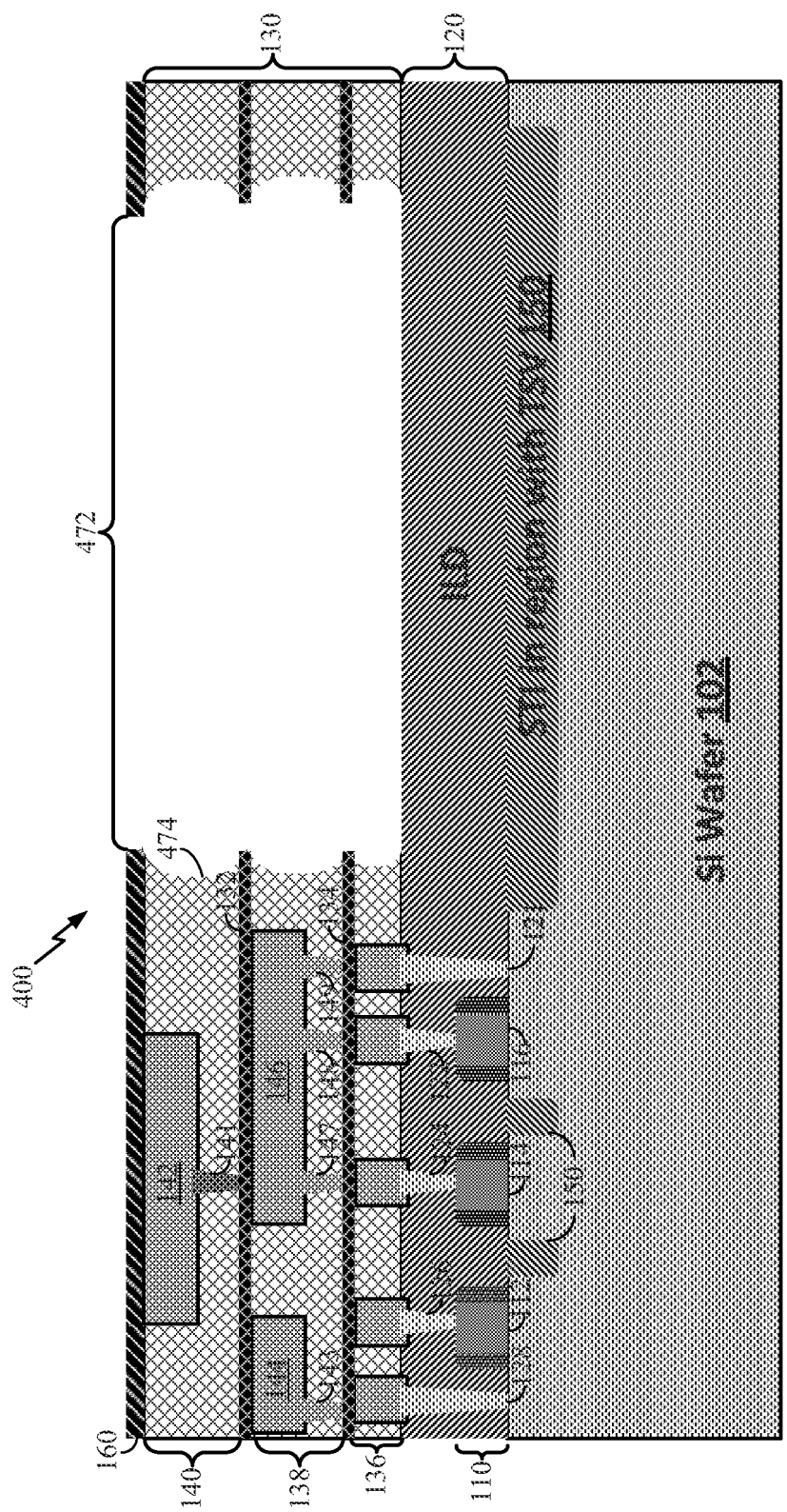
FIG. 4 shows a cross-sectional view illustrating the IC package of FIG. 3, illustrating electrical and mechanical degradation of a low-K interface for a TSV according to one aspect of the present disclosure.

FIG. 4 shows a cross-sectional view illustrating the IC package 400 of FIG. 3, illustrating electrical and mechanical degradation of a low-K interface for a TSV according to one aspect of the present disclosure. In FIG. 4, the photo resist layer 370 has been removed.

It is noted that the interaction between a TSV (e.g., a Bosch) etch used to drill the TSV (through substrate via) and the low-K IMD layers of an interconnect module 130 may lead to both electrical and mechanical degradation of a low-K interface between the low-K interconnect module 130 and a TSV. This process leads to significant serration and damage to the sidewalls 474 of the low-K interconnect module 130 within the via opening 472. Accordingly, a TSV formed with the via opening 472 suffers from a degraded interconnect film. The resultant non-ideal TSV profile may lead to difficulty in subsequent TSV processing, including liner deposition and fill, as well as reducing the TSV yield and integrity.

Figure 5:
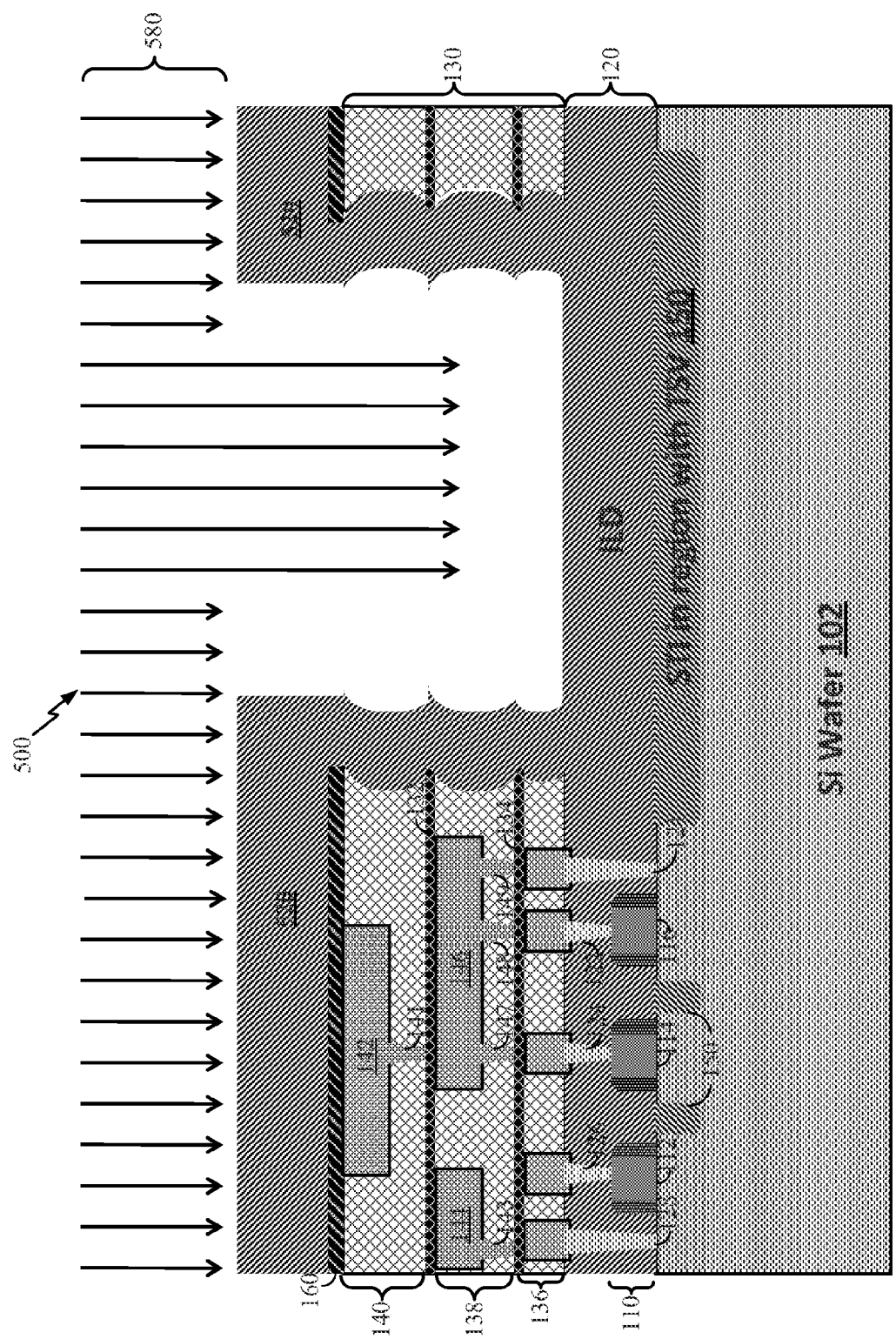
FIG. 5 shows a cross-sectional view illustrating the IC package of FIG. 4, including a protection layer deposition according to one aspect of the present disclosure.

FIG. 5 shows a cross-sectional view illustrating the IC package 500 of FIG. 4, including a protection layer deposition according to one aspect of the present disclosure. As described herein, an etch process that consists of a chemistry that does not attack or damage a low-K material (e.g., containing a low concentration of oxygen) may be referred to as a low-K compatible etch process. In this configuration, a low-K compatible etch process etches through the low-K IMD layers of the low-K interconnect module 130. After the etch lands on a hard silicon oxide (as indicated by an endpoint signal or assisted by a highly selective etch) of either the contact ILD 120 or the STI layer 150, a protective dielectric layer 520 is deposited over the entire IC package 500. The protective dielectric layer 520 may be formed as a layer of unfluorinated silica glass (USG), tetraethyl orthosilicate (TEOS), silicon oxide, silicon nitride, organic films, or other like precursor for forming an insulator film.

As further shown in FIG. 5, a directional etch 580 of the protective dielectric layer 520 is performed. In this configuration, the directional etch 580 may be a directional reactive-ion etching (RIE) process. Representatively, the directional RIE process forms a protective spacer that covers the low-K sidewall 574, while leaving no film over the horizontal surfaces, for example the polish stop layer 160 and the ILD 120. In the illustrated configuration of FIG. 6, a small amount of protective film is left on the horizontal surface of the polish stop layer 160 to improve protection.

Figure 6:
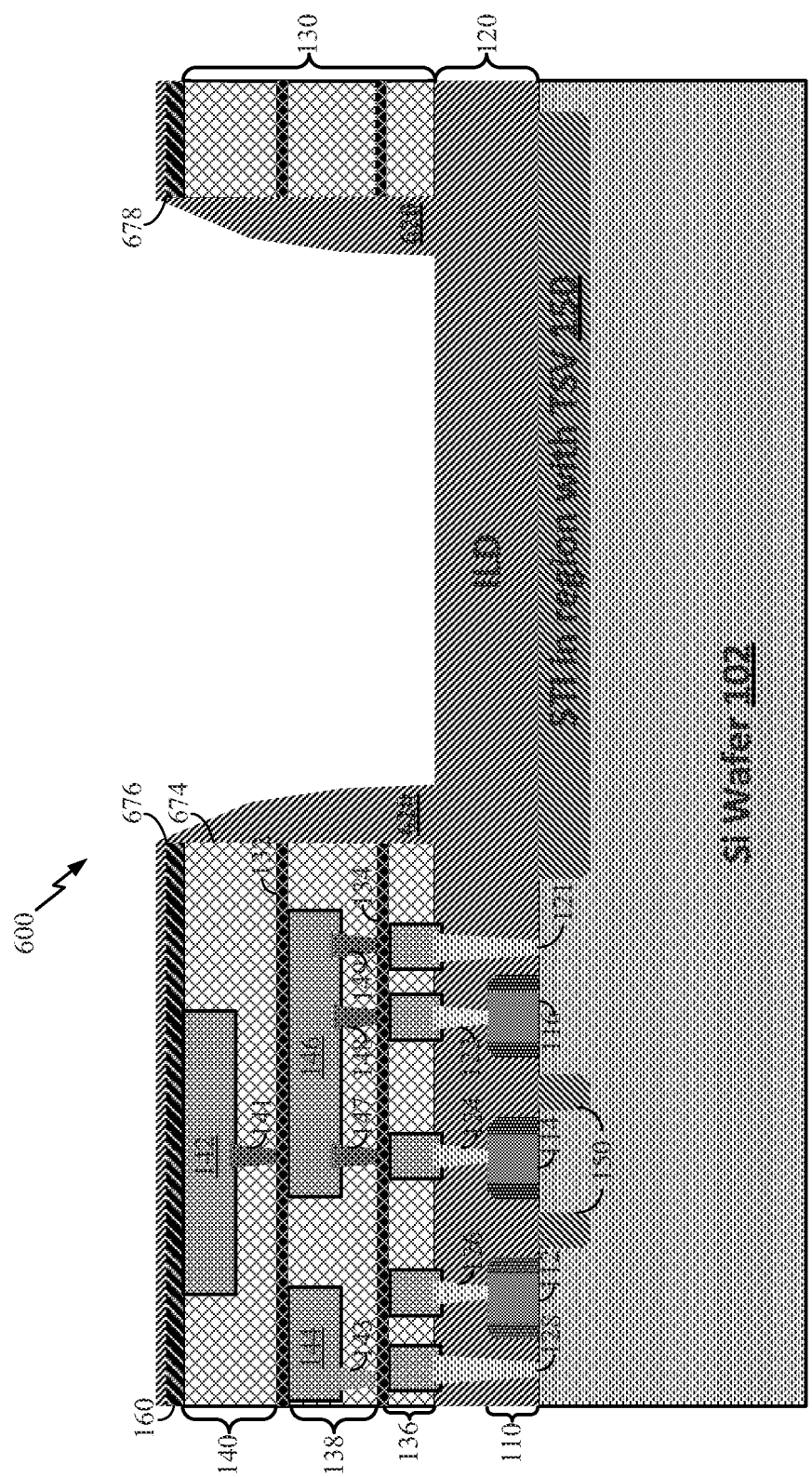
FIG. 6 shows a cross-sectional view illustrating the IC package of FIG. 5, including the sidewall protection spacer layer according to one aspect of the disclosure.

FIG. 6 shows a cross-sectional view illustrating the IC package 600 of FIG. 5, including an etched sidewall protection spacer layer 620 according to one aspect of the present disclosure. Representatively, the sidewall protection spacer 620 protects the low-K interconnect module 130. In addition, the sidewall protection spacer 620 also serves to smooth any topography of the sidewall 674. In the shown configuration, a small amount of protective film is optionally left on the horizontal surfaces of the polish stop layer 160 to provide improved protection of corners 676 and 678. Once the low-K sidewall surface 674 is covered and protected, formation of a via opening through the substrate 102 may be performed as shown in FIG. 7.

Figure 7:
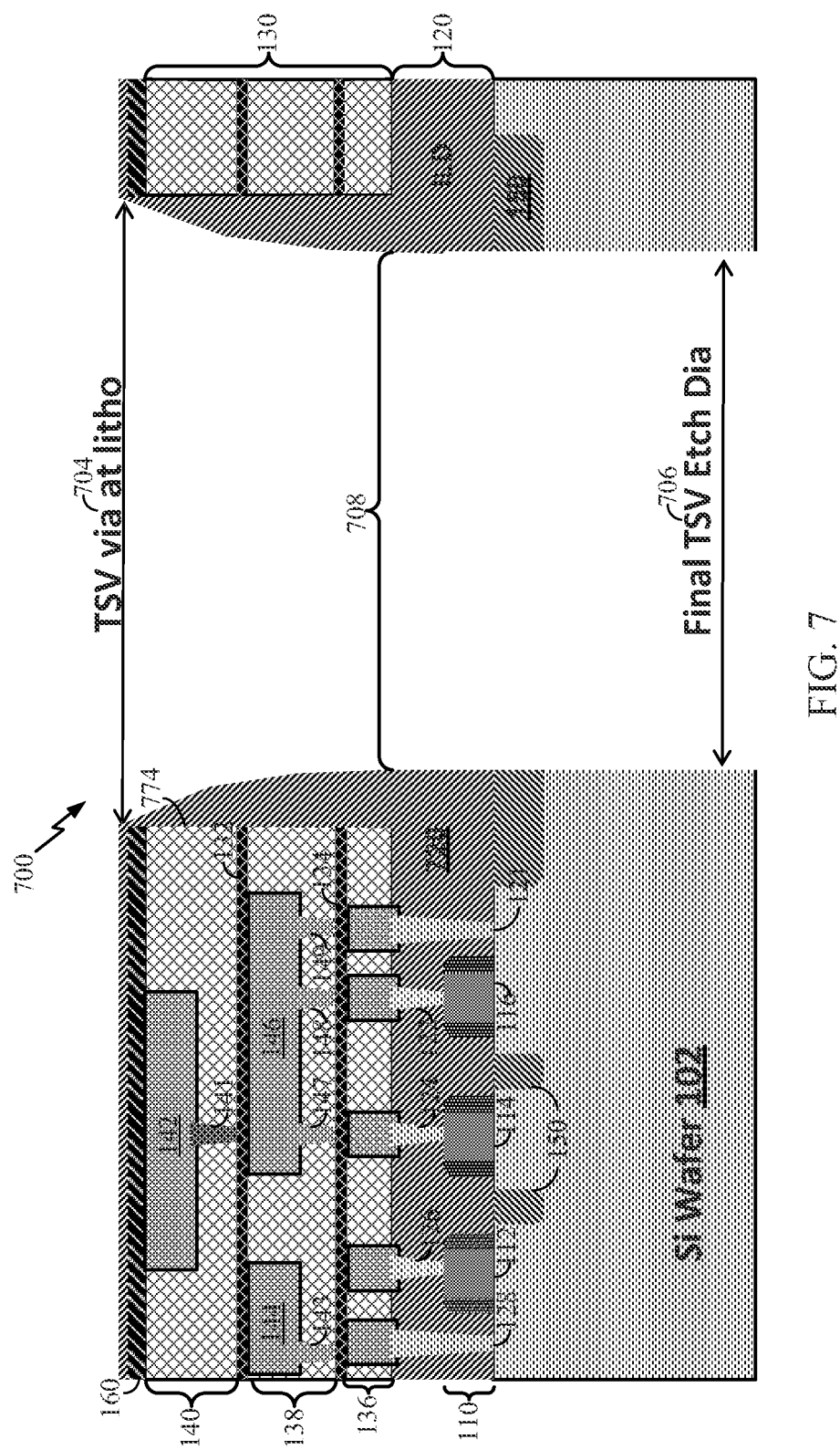
FIG. 7 shows a cross-sectional view illustrating the IC package of FIG. 6, following a through substrate etch according to one aspect of the disclosure.

FIG. 7 shows a cross-sectional view illustrating the IC package 700 of FIG. 6, following a through substrate etch according to one aspect of the present disclosure. Once the low-K sidewall surface 774 is covered and protected with the protective sidewall spacer 720, an etch, such as a Bosch etch, of a TSV opening 708 is performed with minimal concern for the impact of this etch on the low-K interconnect module 130. In this configuration, the protective sidewall spacer 720 reduces the size of the TSV opening from the lithographically defined dimension 704 to a final etch diameter 706. Once etch is complete, a TSV liner/fill/CMP (chemical mechanical polish) process may be performed as shown in FIG. 8.

Figure 8:
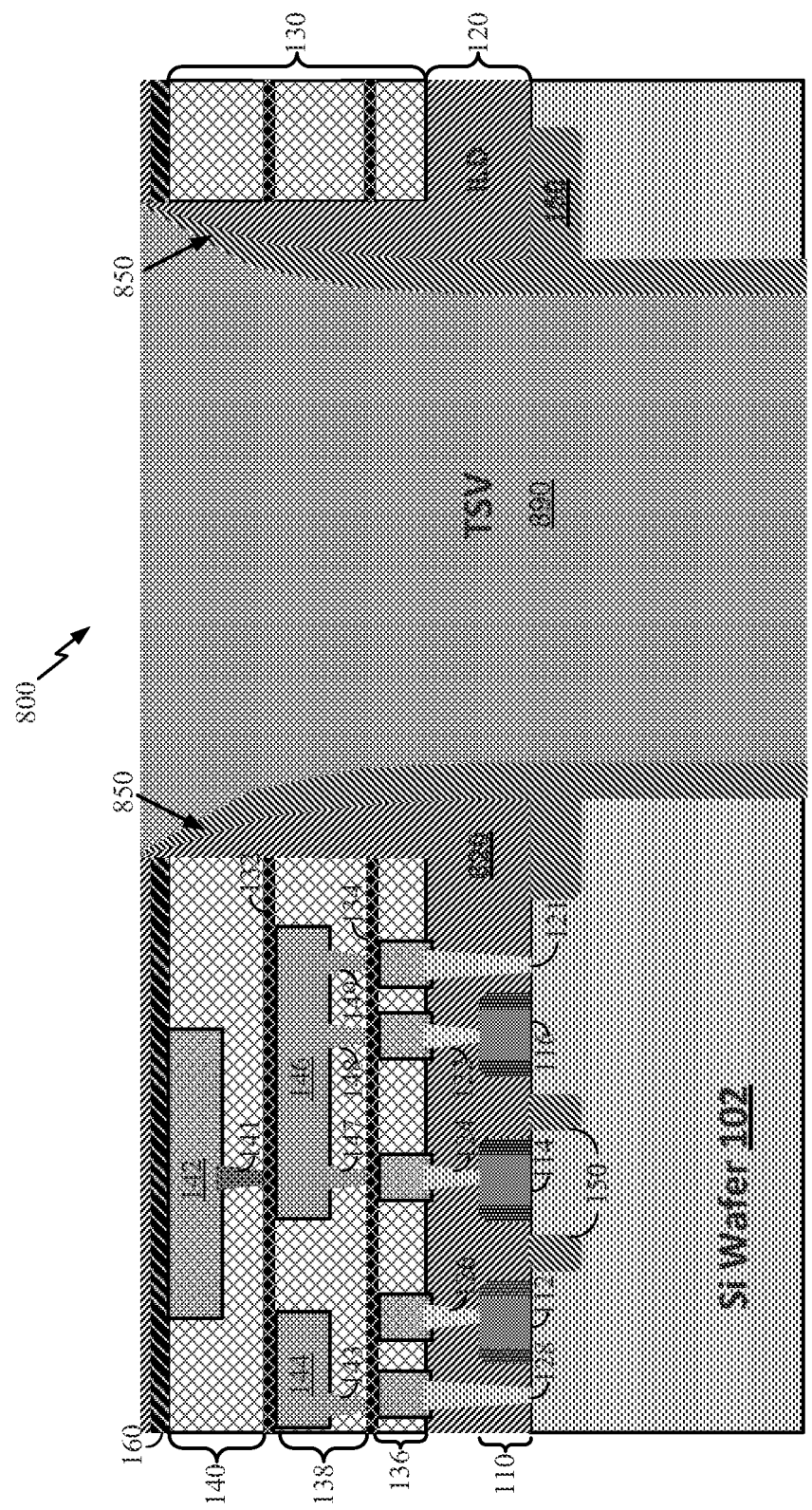
FIG. 8 shows a cross-sectional view illustrating the IC package of FIG. 7, including a through substrate via having a liner isolation layer and a sidewall protection spacer layer according to one aspect of the disclosure.

FIG. 8 shows a cross-sectional view illustrating the IC package 800 of FIG. 7, including a through substrate via 890 having a liner isolation layer 850 and a sidewall protection spacer layer 820 according to one aspect of the present disclosure. Representatively, the portion of the TSV 890 that is embedded in the low-K interconnect module 130 has an oxide buffer layer (protective sidewall spacer) 820 between itself and the low-K interconnect module 130. The oxide buffer layer 820 also provides further stress relief between the TSV 890 and the low-K interconnect module 130 caused by, for example, expansion of the TSV 890. In this configuration, a semi-metallic liner isolation layer 850 is formed surrounding the sidewalk of the TSV 890. The TSV is then filled with copper or other like conductive material.

Although FIG. 8 illustrates formation of the TSV 890 as a final step, additional conductive layers may be formed subsequent to formation of the TSV 890. Accordingly, the use of the sidewall protection spacer 820 may protect the low-K interconnect module sidewall from etch damage, while smoothing of the sidewall surface can lead to improved conditions for post etch processing. Additionally, an oxide buffer provided by the sidewall protection spacer 820 between the TSV 890 and any surrounding material provides additional stress relief. Finally, the sidewall protection spacer 820 may provide the ability to pattern the TSV 890 through any kind of film regardless of whether the film is damaged by the TSV etch.

In one configuration, the IC package 800 including a means for protecting a low-K value dielectric interconnect layer that is disposed between a through via and a low-K value dielectric interconnect layer. In one aspect, the protection means may be the sidewall protection spacer layer 820 of FIG. 8, configured to perform the functions recited by the protection means. In another aspect, the aforementioned means may be a device or any layer configured to perform the functions recited by the aforementioned means.

Figure 9:
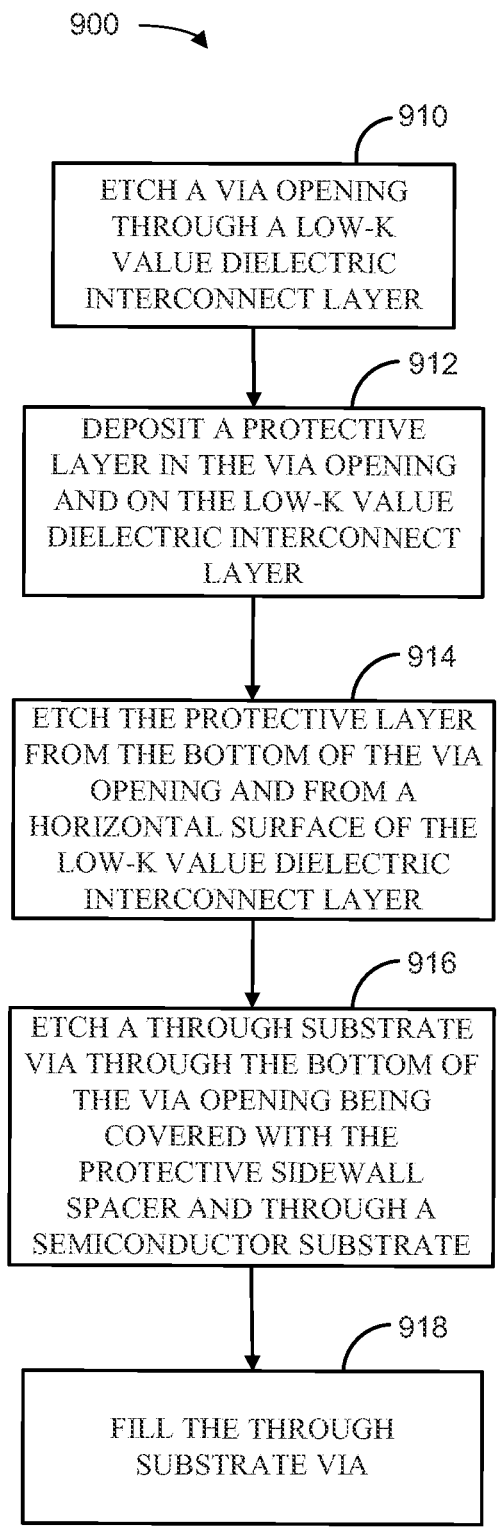
FIG. 9 is a block diagram illustrating a method for forming a low-K dielectric protection spacer for patterning through substrate vias (TSVs) through a low-K wiring layer according to one aspect of the disclosure.

FIG. 9 is a block diagram illustrating a method 900 for forming a low-K dielectric protection spacer for patterning through substrate vias (TSVs) through a low-K wiring layer, according to one aspect of the present disclosure. At block 910, a via opening 272/372/472 is etched through a low-K value dielectric interconnect layer, for example, as shown in FIGS. 2-4. At block 912, a protective dielectric layer 520 is deposited in the via opening and on the low-K value dielectric interconnect layer, for example, as shown in FIG. 5. At block 914, the protective layer is etched from a bottom of the via opening and from a horizontal surface of the low-K value dielectric interconnect layer. For example, as shown in FIG. 6, etching of the protective layer leaves a sidewall protection spacer 620 on a sidewall 674 of the via opening. At block 916, a through substrate via is etched through the bottom of the via opening being covered with the protective sidewall spacer and through a semiconductor substrate, for example, as shown in FIG. 7. At block 918, the through substrate via 890 is filled, for example, as shown in FIG. 8.

Figure 10:
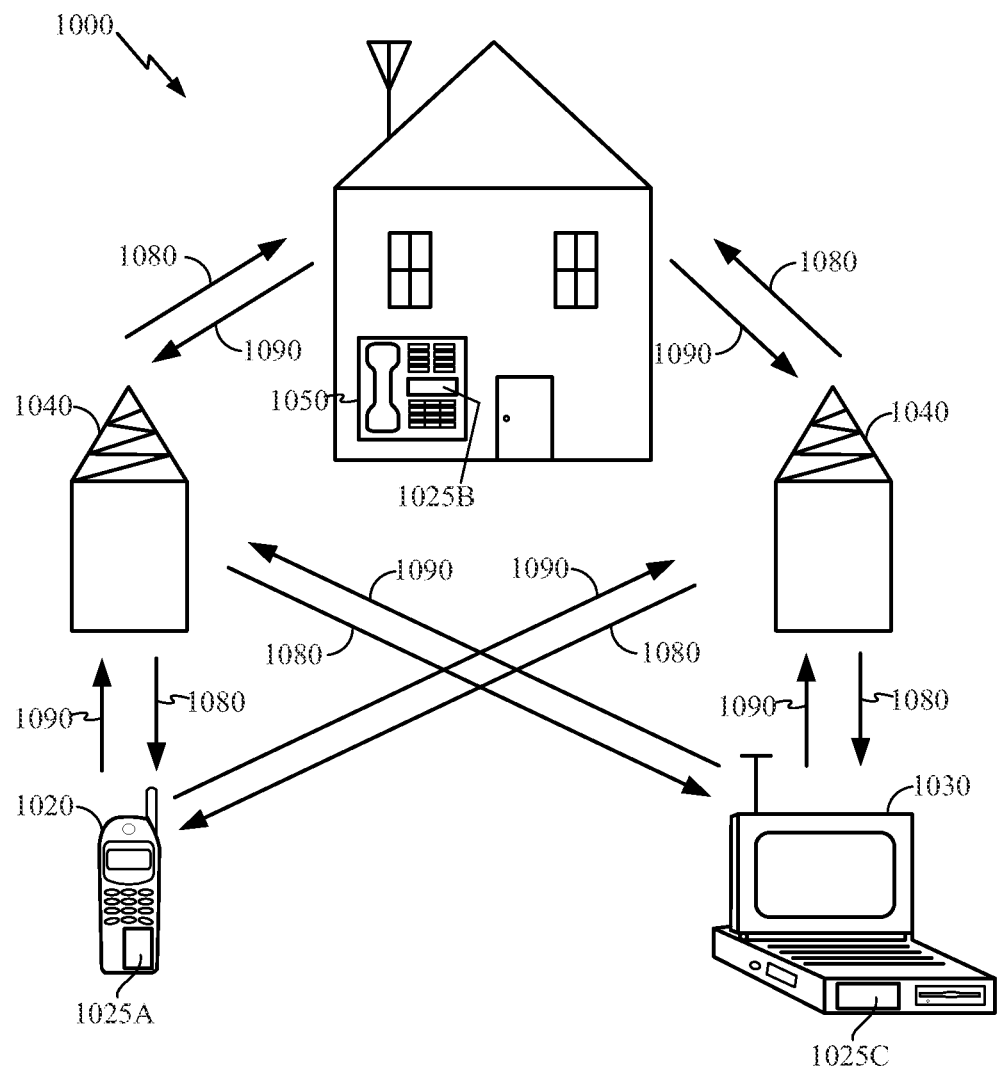
FIG. 10 is a block diagram illustrating a wireless communication system in which an aspect of the disclosure may be advantageously employed.

FIG. 10 is a block diagram showing an exemplary wireless communication system 1000 in which an embodiment of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C and 1025B, that include the disclosed low-K dielectric protection spacer. It will be recognized that any device containing an IC may also include a low-K dielectric protection spacer disclosed here, including the base stations, switching devices, and network equipment. FIG. 10 shows forward link signals 1080 front the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 10 illustrates remote units according to the teachings of the disclosure, the disclosure is not limited to these exemplary illustrated units. Aspects of the present disclosure may be suitably employed in any device which includes the disclosed low-K dielectric protection spacer.

For a firmware and/or software implementation of the design/fabrication process, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
   etching a via opening through a low-K value dielectric interconnect layer;
   depositing a protective layer in the via opening and on the low-K value dielectric interconnect layer;
   etching at least a portion of the protective layer from the bottom of the via opening and from a horizontal surface of the low-K value dielectric interconnect layer, the etching leaving the protective layer as a protective sidewall spacer on a sidewall of the via opening;
   re-flowing the protective layer so that an organic protective layer covers sidewalls of the through substrate via;
   etching a through substrate via through the bottom of the via opening and through the semiconductor substrate; and filling the through substrate via.

2. The method of claim 1, in which the low-K value dielectric interconnect layer comprises at least one low-K value inter-metal dielectric (IMD) layer.

3. The method of claim 1, in which the protective layer is formed from a material selected from a group consisting of unfluorinated silica glass (USG), tetraethyl orthosilicate (TEOS), silicon oxide, and organic films.

4. The method of claim 1, in which etching at least the portion of the protective layer comprises performing a directional reactive-ion etch (RIE) to remove the protective layer from horizontal portions of the low-K value dielectric interconnect layer.

5. The method of claim 1, in which depositing the protective layer comprises forming the protective layer on a top surface of the low-K value dielectric interconnect layer.

6. The method of claim 1, further comprising:
   incorporating the through substrate via within a semiconductor die; and
   integrating the semiconductor die into at least one of a music player, a video player, an entertainment unit, a navigation device, a communications device, a personal digital assistant (PDA), a fixed location data unit, and a computer.

7. A semiconductor die, comprising:
   a semiconductor substrate;
   a shallow trench isolation (STI) region within the semiconductor substrate;
   an inter-layer dielectric (ILD) layer on a surface of the semiconductor substrate and on a surface of the STI region;
   a low-K value dielectric interconnect layer on a surface of the ILD layer opposite the surface of the semiconductor substrate;
   at least one through substrate via extending through the low-K value dielectric interconnect layer, the ILD layer, the STI region and the semiconductor substrate; and
   a protective spacer between the at least one through substrate via and the low-K value dielectric interconnect layer.

8. The semiconductor die of claim 7, in which the low-K value dielectric interconnect layer comprises at least one low-K value inter-metal dielectric (IMD) layer.

9. The semiconductor die of claim 7, in which the protective spacer is comprised of a material selected from a group consisting of unfluorinated silica glass (USG), tetraethyl orthosilicate (TEOS), silicon oxide, and organic films.

10. The semiconductor die of claim 7, in which the protective spacer is on a sidewall portion of the low-K value dielectric interconnect layer.

11. The semiconductor die of claim 7, incorporated into at least one of a music player, a video player, an entertainment unit, a navigation device, a communications device, a personal digital assistant (PDA), a fixed location data unit, and a computer.

12. A semiconductor die, comprising:
    a semiconductor substrate;
    a shallow trench isolation (STI) region within the semiconductor substrate;
    an inter-layer dielectric (ILD) layer on a surface of the semiconductor substrate and on a surface of the STI region;
    a low-K value dielectric interconnect layer on a surface of the ILD layer opposite the surface of the semiconductor substrate;
    at least one through via extending through the low-K value dielectric interconnect layer, the ILD layer, the STI region and the semiconductor substrate; and
    means for protecting the low-K value dielectric interconnect layer disposed between the at least one through via and the low-K value dielectric interconnect layer.

13. The semiconductor die of claim 12, in which the low-K value dielectric interconnect layer comprises at least one low-K value inter-metal dielectric (IMD) layer.

14. The semiconductor die of claim 12, in which the means for protecting the low-K value dielectric interconnect layer is comprised of a material selected from a group consisting of unfluorinated silica glass (USG), tetraethyl orthosilicate (TEOS), silicon oxide, and organic films.

15. The semiconductor die of claim 12, in which the means for protecting the low-K value dielectric interconnect layer is formed on a sidewall portion of the low-K value dielectric interconnect layer.

16. The semiconductor die of claim 12, incorporated into at least one of a music player, a video player, an entertainment unit, a navigation device, a communications device, a personal digital assistant (PDA), a fixed location data unit, and a computer.

17. A method, comprising:
    the step for etching a via opening through a low-K value dielectric interconnect layer;
    the step for depositing a protective layer in the via opening and on the low-K value dielectric interconnect layer;
    the step for etching the protective layer from the bottom of the via opening and from a horizontal surface of the low-K value dielectric interconnect layer, the etching leaving the protective layer as a protective sidewall spacer on a sidewall of the via opening;

the step for re-flowing the protective layer so that an organic protective layer covers sidewalls of the through substrate via;

the step for etching a through substrate via through the bottom of the via opening being covered with the protective sidewall spacer and through a semiconductor substrate; and the step for filling the through substrate via.

18. The method of claim 17, further comprising the step for incorporating the through substrate via within a semiconductor die.

19. The method of claim 18, further comprising the step for incorporating the semiconductor die into at least one of a music player, a video player, an entertainment unit, a navigation device, a communications device, a personal digital assistant (PDA), a fixed location data unit, and a computer.

* * * * *